(12) United States Patent
Gu et al.

(10) Patent No.: US 12,112,696 B2
(45) Date of Patent: Oct. 8, 2024

(54) LIGHT EMITTING DISPLAY APPARATUS AND SUBSTRATE PROVIDING UNIFORM BRIGHTNESS OF DIFFERENT POSITIONS OF SETUP REGION

(71) Applicants: Chengdu BOE Optoelectronics Technology Co., Ltd., Sichuan (CN); BOE TECHNOLOGY GROUP CO., LTD., Beijing (CN)

(72) Inventors: Pinchao Gu, Beijing (CN); Yao Huang, Beijing (CN); Tianyi Cheng, Beijing (CN); Yue Long, Beijing (CN); Yuanyou Qiu, Beijing (CN); Meng Li, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 199 days.

(21) Appl. No.: 17/614,582

(22) PCT Filed: Nov. 27, 2020

(86) PCT No.: PCT/CN2020/132251
§ 371 (c)(1),
(2) Date: Nov. 29, 2021

(87) PCT Pub. No.: WO2022/110015
PCT Pub. Date: Jun. 2, 2022

(65) Prior Publication Data
US 2023/0260454 A1    Aug. 17, 2023

(51) Int. Cl.
*G09G 3/3225*    (2016.01)
*H10K 59/131*    (2023.01)

(52) U.S. Cl.
CPC ......... *G09G 3/3225* (2013.01); *H10K 59/131* (2023.02); *G09G 2300/0408* (2013.01);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS

2003/0151569 A1*  8/2003  Lee ............... G09G 3/3233
                                                345/84
2007/0046593 A1*  3/2007  Shin .............. G09G 3/3233
                                                345/81
(Continued)

*Primary Examiner* — Ke Xiao
*Assistant Examiner* — Nelson Lam
(74) *Attorney, Agent, or Firm* — HOUTTEMAN LAW LLC

(57) ABSTRACT

A display substrate is provided with a setup region including an acquisition region and a transition region adjacent to the acquisition region. The display substrate includes: a base substrate; light emitting devices on the base substrate, at least a part of the light emitting devices are provided in each of the acquisition region and the transition region; and driving circuits on the base substrate, each of the driving circuits being configured to provide a driving signal to a corresponding light emitting device. A driving circuit corresponding to a light emitting device in the transition region is a first local driving circuit which is in the transition region. A driving circuit corresponding to a light emitting device in the acquisition region is a peripheral driving circuit which is in the transition region and is connected to the corresponding light emitting device in the acquisition region through a connection line.

19 Claims, 11 Drawing Sheets

(52) U.S. Cl.
CPC .............. *G09G 2300/0426* (2013.01); *G09G 2300/0819* (2013.01); *G09G 2300/0842* (2013.01); *G09G 2310/0264* (2013.01); *G09G 2310/08* (2013.01); *G09G 2320/0233* (2013.01); *G09G 2370/00* (2013.01)

(58) Field of Classification Search
CPC .. G09G 3/3233; G09G 3/3241; G09G 3/3266; G09G 3/3275; G09G 3/3283; G09G 3/3291; G09G 2300/0408; G09G 2320/0233
USPC ...................................................... 345/76–83
See application file for complete search history.

(56) References Cited

U.S. PATENT DOCUMENTS

| | | | | |
|---|---|---|---|---|
| 2010/0013805 | A1* | 1/2010 | Park | H10K 71/70 345/80 |
| 2010/0118003 | A1* | 5/2010 | Yamashita | G09G 3/3233 345/55 |
| 2010/0289829 | A1* | 11/2010 | Yamamoto | G09G 3/3233 345/690 |
| 2015/0029235 | A1* | 1/2015 | Sato | G09G 3/3233 345/76 |
| 2015/0097820 | A1* | 4/2015 | An | G09G 3/3208 345/82 |
| 2015/0103106 | A1* | 4/2015 | Chaji | G09G 3/3225 345/690 |
| 2023/0138625 | A1* | 5/2023 | Hayashi | G02F 1/133 345/77 |

* cited by examiner 6  3/31   3/32  21

LIGHT EMITTING DISPLAY APPARATUS AND SUBSTRATE PROVIDING UNIFORM BRIGHTNESS OF DIFFERENT POSITIONS OF SETUP REGION

TECHNICAL FIELD

The present disclosure relates to the field of display technology, and in particular to a display substrate, a display panel and a display apparatus.

BACKGROUND

A full screen display apparatus (i.e., a display apparatus in which all positions on a display side may be used for display) is widely used. An "under screen camera" technology may be adopted in the full screen display apparatus, i.e., the camera may be provided on a back side of a display panel (i.e., a side away from the display side) and located in a setup region of the display panel, in order to acquire images in the setup region.

However, in a full screen display apparatus, a problem, such as non-uniform display (e.g., of brightness), may occur at different positions of the setup region.

SUMMARY

The present disclosure provides a display substrate, a display panel and a display apparatus.

In a first aspect, an embodiment of the present disclosure provides a display substrate, including a setup region having an acquisition region for an image acquisition unit and a transition region adjacent to the acquisition region, the display substrate includes a base substrate; a plurality of light emitting devices on the base substrate, at least a part of the plurality of light emitting devices are provided at each of the acquisition region and the transition region; and a plurality of driving circuits on the base substrate, each of which is configured to provide a driving signal to a corresponding light emitting device; driving circuits of the plurality of driving circuits corresponding to light emitting devices in the transition region are referred to as first local driving circuits which are located in the transition region; driving circuits of the plurality of driving circuits corresponding to light emitting devices in the acquisition region are referred to as peripheral driving circuits which are located in the transition region and are connected to the light emitting devices through connection lines, respectively; and at least a part of the connection lines each include: a connection portion between a corresponding light emitting device and a corresponding peripheral driving circuit, and an extension portion connected to the connection portion, and the connection lines are uniformly distributed in the setup region.

In some embodiments, the display substrate further includes a display region adjacent to the setup region; at least a part of the plurality of light emitting devices are provided in the display region; driving circuits corresponding to the light emitting devices in the display region are referred to as second local driving circuits which are located in the display region; and a distribution density of the light emitting devices in the setup region is smaller than a distribution density of the light emitting devices in the display region.

In some embodiments, a distribution density of the light emitting devices in the acquisition region is the same as a distribution density of the light emitting devices in the transition region.

In some embodiments, each of the connection lines is made of a transparent conductive material.

In some embodiments, each of the plurality light emitting devices is an organic light emitting diode.

In some embodiments, the transition region includes at least one sub-transition region outside the acquisition region on at least one side of the acquisition region in a first direction; and the connection line connected to the peripheral driving circuit in each of the at least one sub-transition region extends into the acquisition region at least from a position in the sub-transition region farthest from the acquisition region.

In some embodiments, the transition region includes two sub-transition regions outside the acquisition region on two respective sides of the acquisition region in the first direction.

In some embodiments, the peripheral driving circuit corresponding to the light emitting device in the acquisition region on each side of a middle demarcation line position in the first direction is located in the sub-transition region which is on the same side of the acquisition region as the peripheral driving circuit in the first direction; and the middle demarcation line position is a position at a middle of the acquisition region in the first direction; and the connection line connected to the peripheral driving circuit in each of the sub-transition regions extends at least from a position in the sub-transition region farthest from the acquisition region to the middle demarcation line position of the acquisition region.

In some embodiments, the acquisition region is of a rectangle, and two sides of the rectangle of the acquisition region are parallel to the first direction; and each of the at least one sub-transition region is of a rectangle, and two sides of the rectangle of the sub-transition region are parallel to the first direction.

In some embodiments, the connection line connected to the peripheral driving circuit in each of the sub-transition regions is parallel to the first direction.

In some embodiments, in a second direction perpendicular to the first direction, the connection lines are uniformly distributed in the setup region.

In some embodiments, the driving circuits include output terminals configured to output the driving signals, respectively; the driving circuits in each of the sub-transition regions are arranged in a plurality of rows parallel to the first direction; and the output terminals of the driving circuits in a same row are arranged in a straight line parallel to the first direction; leading out structures are provided to correspond to the peripheral driving circuits, respectively; at least one insulating layer is provided between the leading out structures and the output terminals, and the leading out structure is connected to the output terminal of the peripheral driving circuit through a first via hole; at least one insulating layer is provided between the connection line and the output terminal; at least one insulating layer is provided between the connection line and the leading out structure; and the connection line is connected to the leading out structure through a second via hole; and every two different second via holes are located at different positions in the second direction perpendicular to the first direction.

In some embodiments, the driving circuits in each row include multiple first local driving circuits and multiple peripheral driving circuits; and the multiple first local driving circuits and the multiple peripheral driving circuits in the same row are mixed to be arranged in the first direction.

In some embodiments, the leading out structures have a same shape.

In some embodiments, the light emitting device includes a first electrode; the leading out structure and the first electrode are in a same layer; a corresponding connection line is connected to the first electrode of the light emitting device through a third through hole; and the output terminal of the first local driving circuit is connected to the first electrode of the light emitting device through a fourth via hole.

In some embodiments, a shape of the leading out structure corresponding to each of the peripheral driving circuits is the same as a shape of the first electrode of the light emitting device corresponding to the peripheral driving circuit.

In some embodiments, a first planarization layer is provided on a side of the output terminal of the driving circuit away from the base substrate; the connection line is provided on a side of the first planarization layer away from the base substrate; a second planarization layer is provided on a side of the connection line away from the base substrate; the leading out structure and the first electrode are provided on a side of the second planarization layer away from the base substrate; the first via hole and the fourth via hole are in the first planarization layer and in the second planarization layer; and the second via hole and the third via hole are in the second planarization layer.

In a second aspect, an embodiment of the present disclosure provides a display panel which includes the display substrate as mentioned above.

In a third aspect, an embodiment of the present disclosure provides a display apparatus, which includes the display panel as mentioned above, and an image acquisition unit on a side of the display panel and at a position corresponding to the acquisition region of the display substrate.

In some embodiments, the display apparatus is a full screen display apparatus.

BRIEF DESCRIPTION OF THE DRAWINGS

The drawings are intended to provide a further understanding of the embodiments of the present disclosure and constitute a part of this specification. The drawings together with the embodiments of the present disclosure are used for explaining the present disclosure, but not intended to limit the present disclosure. The above and other features and advantages will become more apparent to those skilled in the art by describing in detail exemplary embodiments thereof with reference to the drawings, in which.

Figure 1:
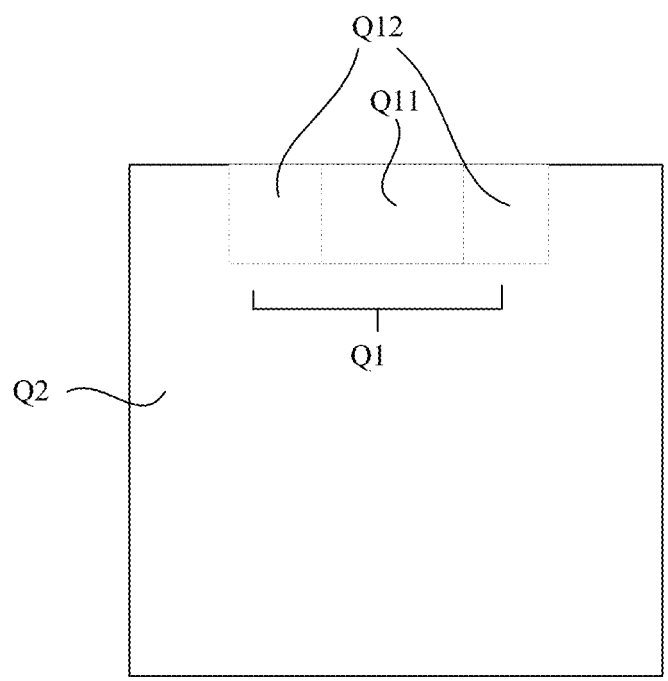
FIG. 1 is a schematic diagram illustrating partitions of a display substrate in the related art.

The reference numerals in the embodiments of the present disclosure denote as follows:

T1: first transistor; T2: second transistor; T3: third transistor; T4: fourth transistor; T5: fifth transistor; T6: sixth transistor; T7: seventh transistor; Cst: storage capacitor; Reset: first reset terminal; Reset': second reset terminal; Vinit: initialization terminal; Gate: gate line terminal; Data: data line terminal; EM: control terminal; VDD: anode signal terminal; VSS: cathode signal terminal; N1: first node; N2: second node;

11: data line; 12: gate line; 13: control electrode line; GI: gate insulation layer; ILD1: first interlayer insulation layer; ILD2: second interlayer insulation layer; PLN1: first planarization layer; PLN2: second planarization layer;

Q1: setup region; Q11: acquisition region; Q12: transition region; Q121: sub-transition region; Q2: display region; 9: base substrate; 91: first direction; 92: second direction; 99: middle demarcation line position;

2: light emitting device; 21: first electrode; OLED: organic light emitting diode;

3: driving circuit; 31: peripheral driving circuit; 32: first local driving circuit; 33: second local driving circuit; 39: output terminal;

4: leading out structure;

51: first via hole; 52: second via hole; 53: third via hole; 54: fourth via hole;

6. connection line; 61: connection portion; 62. extension portion.

DETAILED DESCRIPTION

In order to make those skilled in the art better understand the technical solutions of the embodiments of the present disclosure, a display substrate, a display panel and a display apparatus in the embodiments of the present disclosure will be described in detail below with reference to the accompanying drawings.

The embodiments of the present disclosure will be described more fully hereinafter with reference to the accompanying drawings, but the embodiments shown may be embodied in different forms and should not be construed as limited to the embodiments set forth herein. On the contrary, the purpose of providing these embodiments is to make the present disclosure thorough and complete, and to enable those skilled in the art to fully understand the scope of the present disclosure.

The embodiments of the present disclosure may be described by way of ideal schematic diagrams of the present disclosure with reference to plan and/or cross-sectional views thereof. Accordingly, the example drawings may be modified in accordance with manufacturing techniques and/or tolerances.

The embodiments of the present disclosure and the features in the embodiments may be combined with each other without conflict.

The terms are merely used in the present disclosure for the purpose of describing particular embodiments and are not intended to limit the present disclosure. As used in the present disclosure, the term "and/or" includes any one or more of the associated listed items and all combinations thereof. As used in the present disclosure, the singular forms "a (an)" and "said" are intended to also include the plural forms, unless the context clearly indicates otherwise. As used in the present disclosure, the terms "comprising (including)", "consisting of", specify the presence of features, entities, steps, operations, elements, and/or components, but do not exclude the presence or addition of one or more other features, entities, steps, operations, elements, components, and/or groups thereof.

Unless otherwise defined, all terms (including technical and scientific terms) used in the present disclosure have the same meaning as commonly understood by those skilled in the art. It will be further understood that, the terms, such as those defined in commonly used dictionaries, should be interpreted as having meanings that are consistent with their meanings in the context of the related art and the present disclosure, and will not be interpreted as having meanings in an ideal or overly formal sense unless expressly so defined in the present disclosure.

The embodiments of the present disclosure are not limited to the embodiments shown in the drawings, but include modifications of configurations formed based on manufacturing processes. Thus, the regions illustrated in the drawings are schematic, and the shapes of the regions illustrated in the drawings illustrate specific shapes of regions in which the elements are located, which is not intended to be restrictive.

Description of Technical Terms

In the present disclosure, unless otherwise defined, the following technical terms should be understood in accordance with the following explanations.

The term "a plurality of structures being in a same layer" means that the plurality of structures are made of a same material layer and thus are in a same layer in the laminated relationship, but does not mean that the distances between the plurality of structures and a base substrate are the same or that other structures in the layers between the plurality of structures and the base substrate are exactly the same.

The term "patterning process" refers to steps of forming a structure having a specific pattern, and the "patterning process" may be a photolithography process including one or more steps of forming a material layer, coating photoresist, exposing, developing, etching, stripping photoresist, and the like. Of course, the patterning process may be any other process, such as an imprinting process and an inkjet printing process.

The term "A structure being on a side of B structure away from a base substrate" refers to that a layer where the B structure is located is formed prior to a layer where the A structure is located, so that the A structure is located in a layer more away from the base substrate than the layer where the B structure is located in terms of the laminated relationship, and thus in a case where both the A structure and the B structure are present at a certain position of the base substrate, the A structure is necessarily more away from the base substrate than the B structure. However, the above description does not mean that the B structure is necessarily sandwiched between the A structure and the base substrate at any position of the base substrate.

The term "uniform distribution of certain structures in a certain region/in a certain direction" refers to that the distribution (including the number, area, position, etc.) of the certain structures is substantially the same in any one sufficiently large and same range in a corresponding region/in a corresponding direction. It should be understood that, the above description does not mean that the distribution of the structures is exactly the same in any one very small range.

The term "distribution density of certain structures in a certain region" refers to the value of the number and/or the area of the structures distributed in any one sufficiently large and same range in a corresponding region. It should be understood that, the above description does not mean that the number and/or the area of the structures distributed in any one small range are the same.

The term "two structures of a same shape" refers to that the patterns formed by the two structures, and the direction and size of the patterns are the same. That is, an orthographic projection of one structure after "moved without being rotated" on the base substrate is coincident with an orthographic projection of another structure on the base substrate.

The term "transistor" may be specifically a "thin film transistor (TFT)" which refers to a device including at least three terminals, i.e., a gate electrode, a drain electrode, and a source electrode, and an active region connected to and between the source electrode and the drain electrode. By controlling the voltages on the gate electrode, the source electrode, and the drain electrode, the drain electrode and the source electrode may be insulated from each other and a current may not flow therebetween (i.e., the transistor is turned off), or a current may flow through the active region from the source electrode to the drain electrode (i.e., the transistor is turned on).

The term "drain electrode and source electrode of a transistor" are distinguished from each other by the flow direction of the current, so that there is no definite source electrode or drain electrode for the transistor itself when there is no current flowing between the source electrode and the drain electrode. Thus, in the embodiments of the present disclosure, first and second electrodes represent two electrodes, i.e., the source electrode and the drain electrode of the transistor, but there is no necessary correspondence between the first and second electrodes and the source and drain electrodes.

Related Art

In the related art, since a "non-display region" special for a camera is not provided in a full screen display apparatus (i.e., a display apparatus capable of displaying at all positions of its display side), an "under screen camera" technology may be adopted when an image on the display side needs to be acquired (i.e., a "front camera" is needed).

That is, referring to FIG. 1, a display region Q2 of a display substrate of a full screen display apparatus includes a setup region Q1 (also called an L region), which may also perform display but has less structures of blocking light. Thus, in a case where an image acquisition unit (e.g., a camera) is provided on a back side (i.e., a side away from a display side) of a display panel at a position corresponding to/in the setup region Q1, an image on the display side may be acquired in the setup region Q1.

Figure 2:
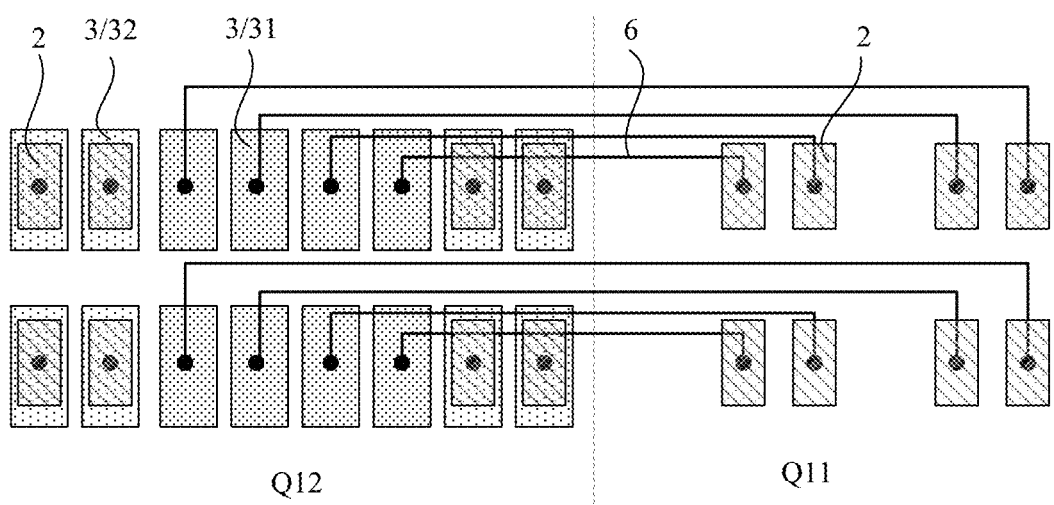
FIG. 2 is a schematic diagram illustrating a layout of connection lines in a partial region of a display substrate in the related art.

Referring to FIG. 2, in order to achieve display, light emitting devices 2 (e.g., organic light emitting diodes OLED) are necessarily provided in the setup region Q1. However, driving circuits 3 (also called pixel circuits) are required to provide driving signals for the light emitting devices 2 to operate, and the driving circuits 3 block light seriously, which may seriously affect image acquisition.

Figure 15:
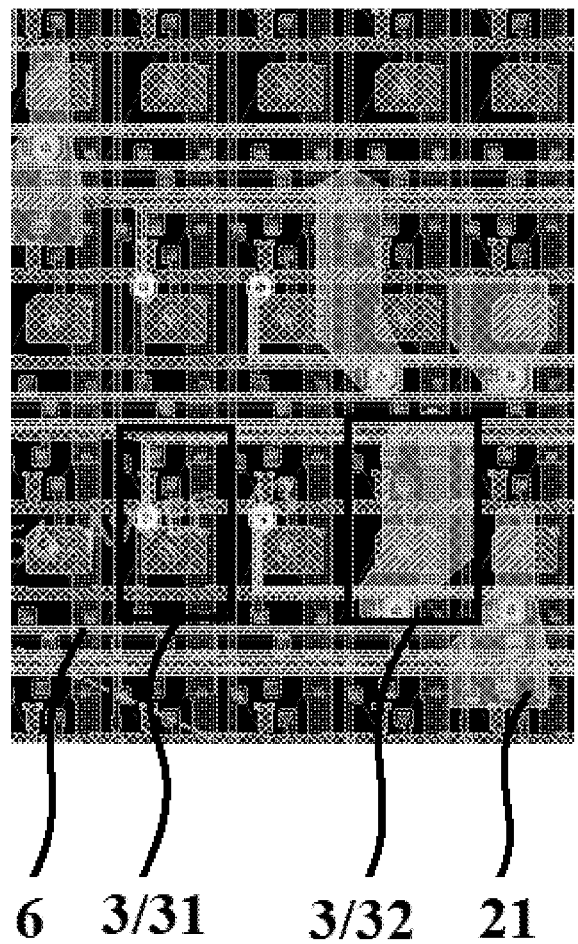
FIG. 15 is a schematic diagram illustrating a layout in a partial region of a display substrate in the related art.

For solving this problem, referring to FIG. 1, FIG. 2 and FIG. 15, the setup region Q1 is subdivided into an acquisition region Q11 and a transition region Q12. The acquisition region Q11 is only provided with the light emitting devices 2, so that the image acquisition unit may be specifically provided in the acquisition region Q11 to acquire images in the acquisition region Q11. The driving circuits 3 corresponding to the light emitting devices 2 in the acquisition region Q11 are referred to as peripheral driving circuits 31, and the peripheral driving circuits 31 are provided in the transition region Q12 and connected to corresponding light emitting devices 2 in the acquisition region Q11 respectively through connection lines 6 made of a material such as indium tin oxide (ITO), so as to provide the driving signals for the light emitting devices 2, respectively. Of course, the driving circuits 3 (i.e., first local driving circuits 32) corresponding to the light emitting devices 2 in the transition region Q12 may be located in the transition region Q12.

Obviously, different peripheral driving circuits 31 are located at different positions in the transition region Q12, and different light emitting devices 2 are similarly located at different positions in the acquisition region Q11, and the connection lines 6 between the different peripheral driving circuits 31 and the different light emitting devices 2 are also located at different positions. Thus, referring to FIG. 2, in the transition region Q12, a larger number of connection lines 6 pass a position closer to the acquisition region Q11 (on a right side of the transition region Q12 in FIG. 2), while a smaller number of connection lines 6 pass a position more away from the acquisition region Q11 (on a left side of the transition region Q12 in FIG. 2). Similarly, in the acquisition region Q11, a larger number of connection lines 6 pass a positions closer to the transition region Q12 (on a left side of the acquisition region Q11 in FIG. 2), while a smaller number of connection lines 6 pass a position more away from the transition region Q12 (on a right side of the acquisition region Q11 in FIG. 2).

Figure 16:
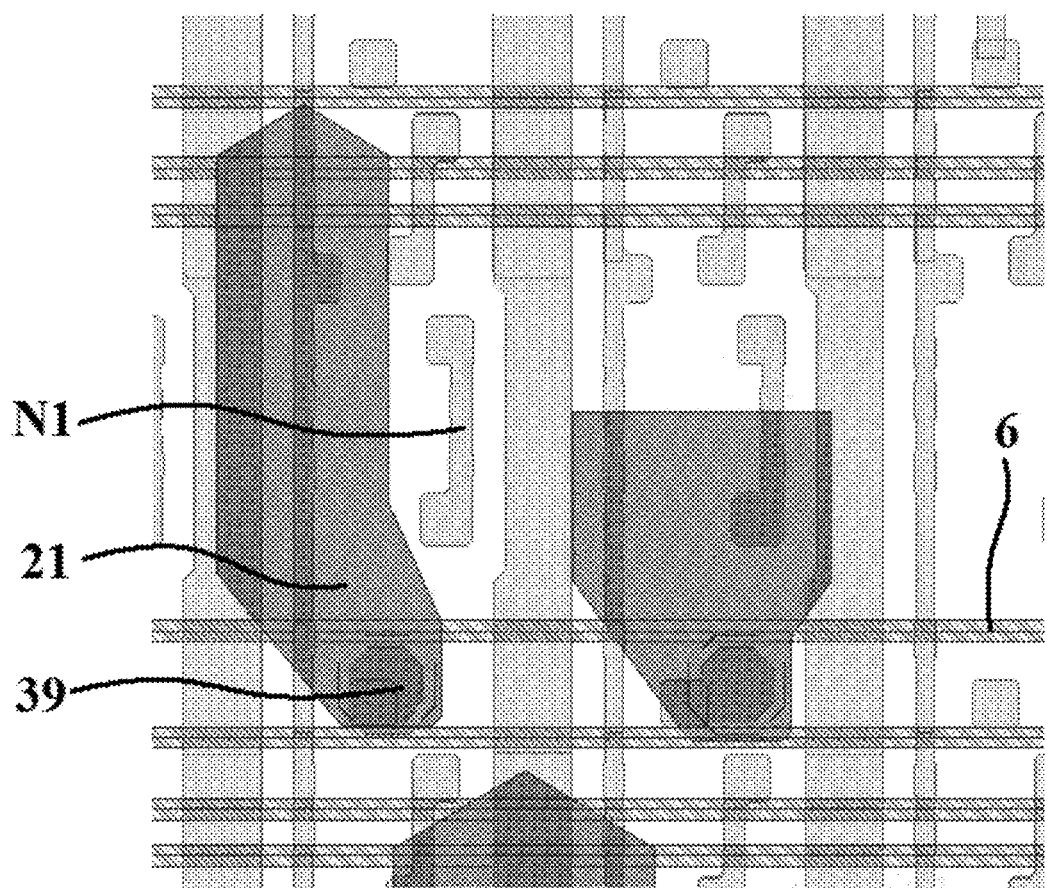
FIG. 16 is a schematic diagram illustrating an embodiment in which connection lines are overlapped with a part of a structure of a driving circuit at a partial region of a display substrate in the related art.
Figure 17:
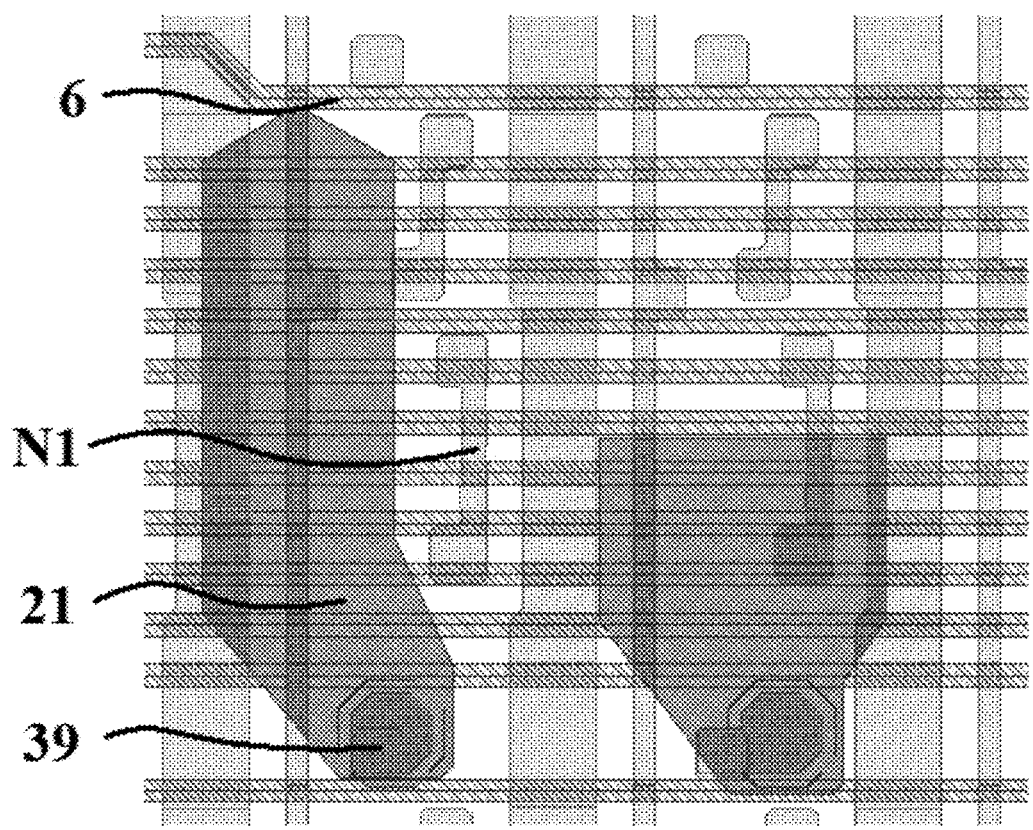
FIG. 17 is a schematic diagram illustrating an embodiment in which connection lines are overlapped with a part of a driving circuit at a partial region of a display substrate in the related art.

The connection lines 6 overlap with (and are of course insulated from) the driving circuits 3, and are connected to the driving circuits 3 (e.g. connected to gate electrodes of driving transistors), respectively. Referring to FIG. 16 and FIG. 17, non-uniform distribution of the connection lines 6 may result in that different numbers of the connection lines 6 overlap with different driving circuits 3. For example, the number of the connection lines 6 overlapping with first nodes N1 (i.e., nodes connected to gate electrodes of driving transistors) of driving circuits 3 are different, so that the different driving circuits 3 are subjected to different coupling effect from the connection lines 6 (e.g., resulting in different changes to gate voltages of the driving transistors), thereby resulting in different display effect (e.g., different brightness) of the light emitting devices 2 corresponding to different driving circuits 3.

Figure 14:
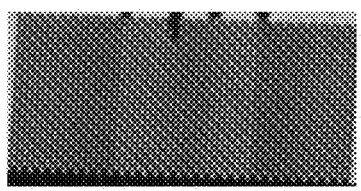
FIG. 14 is a schematic diagram illustrating brightness regions and dark regions occurring in a display apparatus in the related art.

Thus, the display effect at different positions of the setup region Q1 in the related art is not uniform, which will for example result in occurrence of brightness regions and dark regions as shown in FIG. 14.

Detailed Description of the Embodiments of the Present Disclosure

In a first aspect, referring to FIG. 3 to FIG. 13 and FIG. 18, an embodiment of the present disclosure provides a display substrate including a setup region Q1 including an acquisition region Q11 for an image acquisition unit and a transition region Q12 adjacent to the acquisition region Q11. The display substrate includes: a base substrate 9; a plurality of light emitting devices 2 on the base substrate 9, at least the acquisition region Q11 and the transition region Q12 being provided with a part of the plurality of light emitting devices 2; and a plurality of driving circuits 3 on the base substrate 9, each of the driving circuits 3 being configured to provide a driving signal to corresponding light emitting device 2.

The driving circuits 3 corresponding to the light emitting devices 2 in the transition region Q12 are first local driving circuits 32 located in the transition region Q12.

The driving circuits 3 corresponding to the light emitting devices 2 in the acquisition region Q11 are peripheral driving circuits 31. The peripheral driving circuits 31 are in the transition region Q12 and connected to corresponding light emitting devices 2 in the acquisition region Q11 through connection lines 6, respectively.

At least some of the connection lines 6 each include: a connection portion 61 between the light emitting device 2 and a corresponding peripheral driving circuit 31, and an extension portion 62 connected to the connection portion 61. In the setup region Q1, the connection lines 6 are uniformly distributed.

The display substrate of the embodiments of the present disclosure may be a display substrate used in a display apparatus, such as an array substrate.

Figure 10:
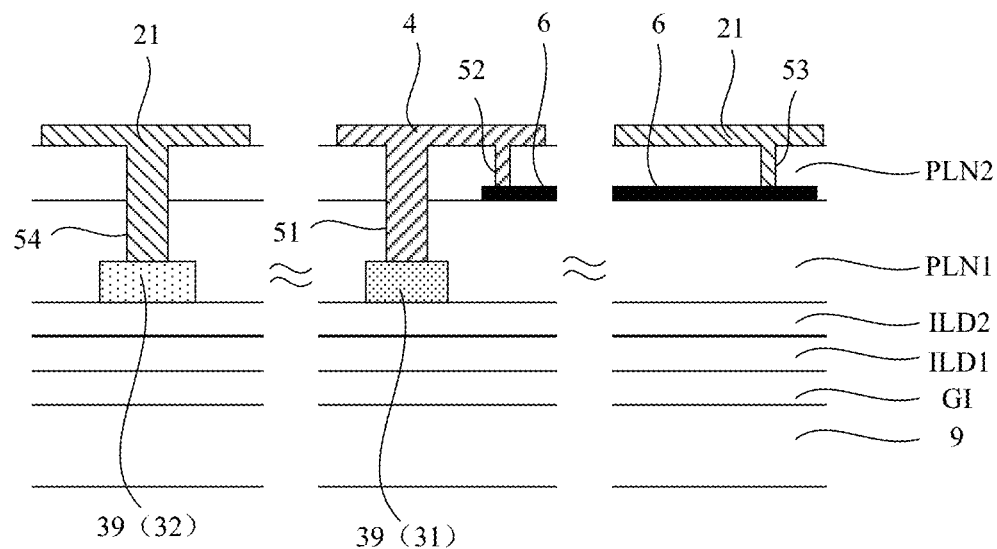
FIG. 10 is a schematic cross-sectional view of a part of a display substrate according to an embodiment of the present disclosure.

Referring to FIG. 10, the base substrate 9 is a base for supporting other structures of the display substrate. The base substrate 9 has a substantially sheet structure made of a transparent material, such as glass, which may be rigid or flexible and has a thickness of millimeter order.

Figure 5:
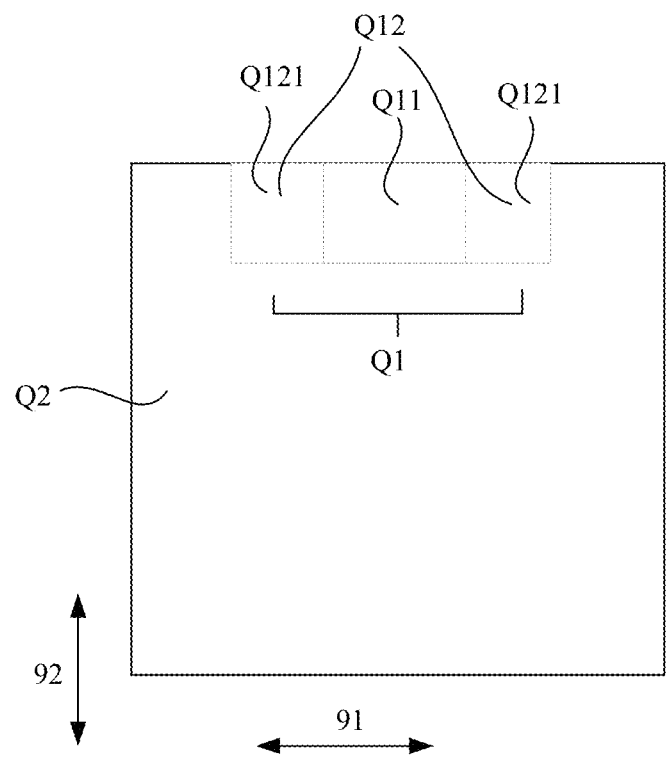
FIG. 5 is a schematic diagram illustrating partitions of a display substrate according to an embodiment of the present disclosure.

Referring to FIG. 5, the display substrate has a "setup region Q1" for the image acquisition unit (such as a camera). That is, the image acquisition unit in a display apparatus is on a back side (i.e., a side away from a display side) of the display substrate and at a position corresponding to the setup region Q1.

The setup region Q1 is divided into an acquisition region Q11 and a transition region Q12. The image acquisition unit is specifically provided at a position corresponding to the acquisition region Q11, so that images on the display side are acquired in the acquisition region Q11, while the transition region Q12 (i.e., "another region" of the setup region Q1) is a region adjacent to the acquisition region Q11 and belongs to the setup region Q1.

Referring to FIG. 7, FIG. 8, FIG. 9 and FIG. 11, light emitting devices 2 are provided in both the acquisition region Q11 and the transition region Q12 of the setup region Q1. A light emitting device 2 is a device capable of emitting light with a desired brightness, i.e., each of the light emitting devices 2 corresponds to one "sub-pixel" in a display apparatus.

A sub-pixel refers to a minimum structure that may be used to independently display desired contents, i.e., a minimum "light emitting dot" that may be independently controlled in a display apparatus.

Different sub-pixels may emit light of different colors, so that a color display may be achieved by mixing light from different sub-pixels. When a color display is to be implemented, a plurality of sub-pixels of different colors arranged together may form one "pixel (i.e., pixel unit)". That is, light emitted by these sub-pixels is mixed together to form a "light dot" in vision. For example, three sub-pixels of three colors of red, green and blue may form one pixel, or four sub-pixels of one red sub-pixel, one blue sub-pixel and two green sub-pixels may form one pixel. Alternatively, instead of definite pixels (i.e., pixel units), the color display may be achieved by "sharing" a sub-pixel among adjacent sub-pixels.

Referring to FIG. 7, FIG. 8, FIG. 9 and FIG. 11, in the embodiments of the present disclosure, light emitting devices 2 are provided in both the acquisition region Q11 and the transition region Q12. That is, "sub-pixels" are provided throughout the setup region Q1, so that the entire setup region Q1 may be used for display.

Since the acquisition region Q11 is not completely covered by the light emitting devices 2 and a certain amount of light may penetrate through between the light emitting devices 2, the image acquisition unit may still acquire the image through the acquisition region Q11 even though the acquisition region Q11 is provided with the light emitting devices 2.

The light emitting device 2 needs to be provided with the driving signal by a corresponding driving circuit 3 (also called the pixel circuit) to operate.

Referring to FIG. 7, FIG. 8, FIG. 9 and FIG. 11, since the driving circuits 3 block light seriously, in the embodiments of the present disclosure, although the acquisition region Q11 is provided with the light emitting devices 2, the driving circuits 3 corresponding to the light emitting devices 2 in the acquisition region Q11 are not provided in the acquisition region Q11 but in the transition region Q12. These driving circuits 3 in the transition region Q12 corresponding to the light emitting devices 2 in the acquisition region Q11 are referred to as "peripheral driving circuits 31", while the driving circuits 3 corresponding to the light emitting devices 2 in the transition region Q12 are directly located (e.g. directly adjacent to the corresponding light emitting devices 2) in the transition region Q12. The driving circuits 3, which are in the transition region Q12 together with the corresponding light emitting devices 2, are referred to as "first local driving circuits 32".

In order to enable a driving signal generated by a peripheral driving circuit 31 to be input to a corresponding light emitting device 2, the peripheral driving circuit 31 is also required to be connected to a corresponding light emitting device 2 through the connection line 6. Specifically, for example, an "output terminal 39" of the driving circuit 3 for outputting the driving signal is electrically coupled to a corresponding electrode (e.g. a first electrode 21) of the light emitting device 2 through the connection line 6.

The driving circuits 3 may have various specific forms.

Figure 3:
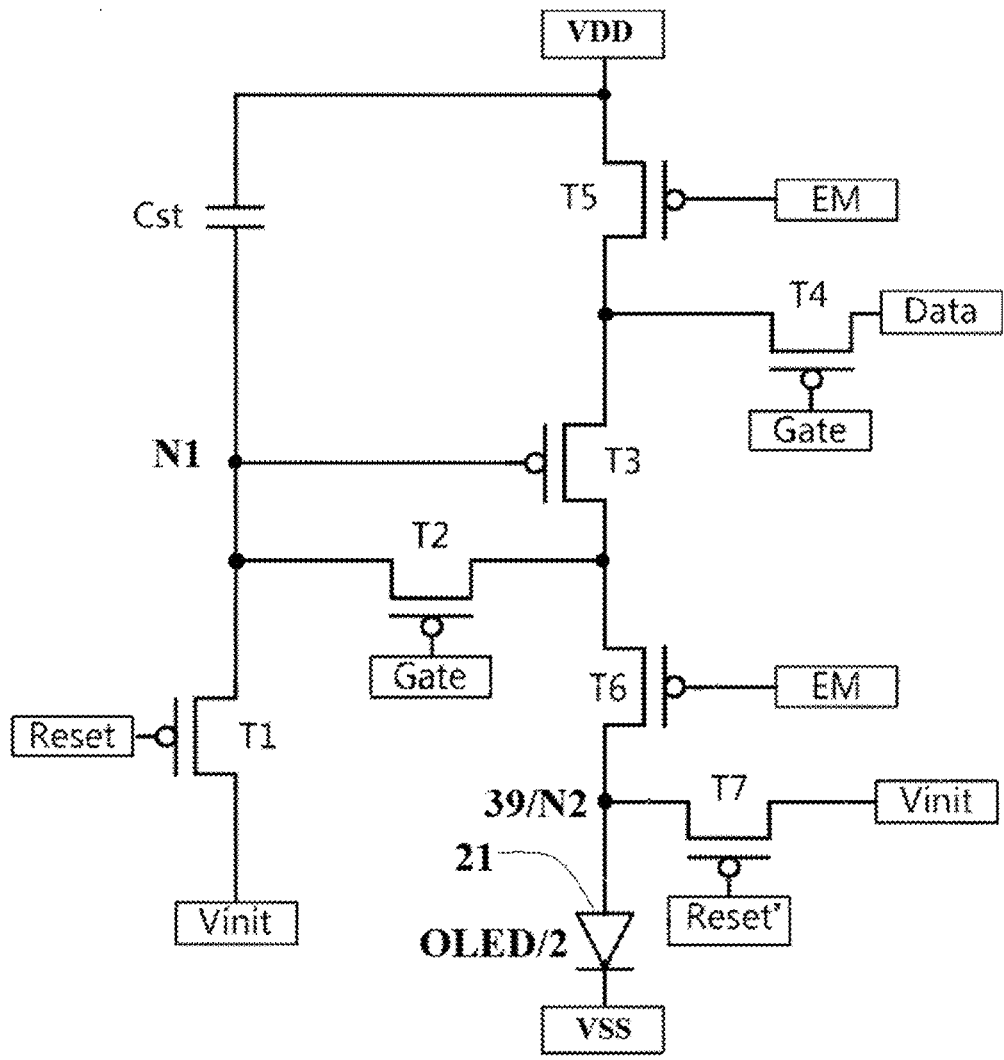
FIG. 3 is a circuit diagram of a driving circuit used in a display substrate according to an embodiment of the present disclosure.
Figure 4:
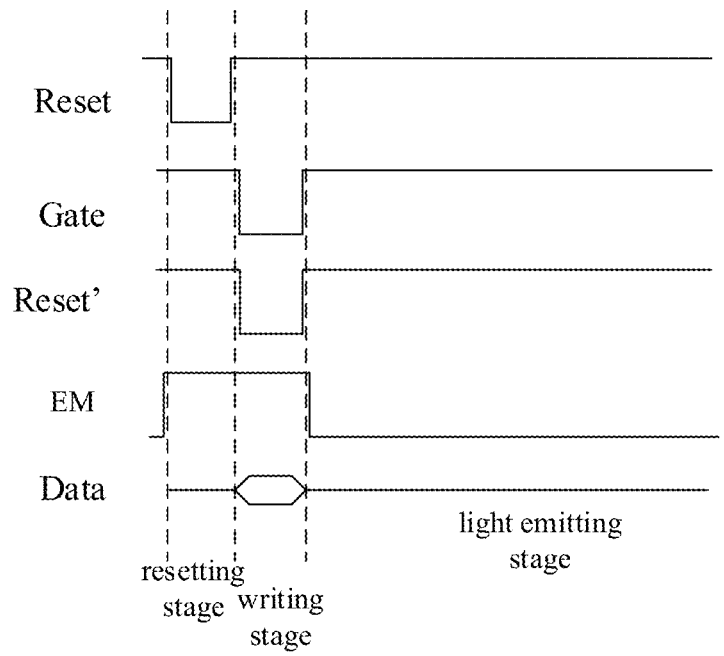
FIG. 4 is a driving timing diagram of a driving circuit used in a display substrate according to an embodiment of the present disclosure.

For example, referring to FIG. 3, the driving circuit 3 may have a structure of 7T1C (e.g., including 7 transistors and 1 capacitor) including a first transistor T1, a second transistor T2, a third transistor T3 (a driving transistor), a fourth transistor T4, a fifth transistor T5, a sixth transistor T6, a seventh transistor T7, a storage capacitor Cst, a first reset terminal Reset, a second reset terminal Reset', an initialization terminal Vinit, a gate line terminal Gate, a data line terminal Data, a control terminal EM, an anode signal terminal VDD, a cathode signal terminal VSS, and the like. Each of the transistors may be a P-type transistor (e.g., PMOS).

The operation process of the above driving circuit 3 may include a resetting stage, a writing stage, and a light emitting stage. In each of the stages, an initialization voltage is continuously provided to the initialization terminal Vinit, an anode voltage Vdd is continuously provided to the anode signal terminal VDD, and a cathode voltage Vss is continuously provided to the cathode signal terminal VSS. In each of the stages, the signals provided to the other signal terminals may be referred to FIG. 4 as follows.

In the resetting stage S101, the first reset terminal Reset is provided with a low level signal (i.e., a turn-on signal), the second reset terminal Reset' is provided with a high level signal (i.e., a turn-off signal), the gate line terminal Gate is provided with a high level signal, and the control terminal EM is provided with a high level signal.

Taking a case where all of the transistors are P-type transistors as an example, the low level signal is a signal which turns on a corresponding transistor, i.e., a turn-on signal, and the high level signal is a signal which turns off a corresponding transistor, i.e., a turn-off signal.

If all of the transistors are N-type transistors, the levels the turn-on signal and the turn-off signal should be opposite to the above case. That is, for an N-type transistor, the high level signal is a signal which turns on a corresponding transistor, i.e., a turn-on signal, and the low level signal is a signal which turns off a corresponding transistor, i.e., a turn-off signal.

In this stage, the first transistor T1 is turned on, so that the voltage at the first node N1 is reset by the voltage from the initialization terminal Vinit.

In the writing stage S102, a high level signal is provided to the first reset terminal Reset, a low level signal is provided to the second reset terminal Reset', a low level signal is provided to the gate line terminal Gate, and a high level signal is provided to the control terminal EM.

In this stage, the fourth transistor T4 is turned on, so that a data voltage Vdata provided from the data line terminal Data reaches the third transistor T3, and a voltage, i.e., Vdata-Vth, is written into the first node N1, where Vth is a threshold voltage of the third transistor T3. Meanwhile, the voltage at a second node N2 is reset by the voltage from the initialization terminal Vinit.

In other stages, the data line terminal Data actually receives data voltages corresponding to other driving circuits 3, but the data voltages are not written into the driving circuit 3 because the fourth transistor T4 is turned off in the other stages.

In the light emitting stage S103, a high level signal is provided to the first reset terminal Reset, a high level signal is provided to the second reset terminal Reset', a high level signal is provided to the gate line terminal Gate, and a low level signal is provided to the control terminal EM.

In this stage, the fifth transistor T5 and the sixth transistor T6 are both turned on, so that the light emitting device 2 may continue to emit light until a next resetting stage (i.e., a next frame) comes.

The storage capacitor Cst maintains the voltage of the first node N1 at Vdata−Vth, and the voltage at the first electrode of the third transistor T3 is the anode voltage Vdd from the anode signal terminal VDD, so that a gate-source voltage Vgs of the third transistor T3 is Vdd−(Vdata−Vth). A driving current Ioled flowing through the third transistor T3 (i.e., the driving transistor) is proportional to the difference between the gate-source voltage Vgs thereof and the threshold voltage Vth thereof, i.e., the driving current Ioled is proportional to Vdd−(Vdata−Vth)−Vth=Vdd−Vdata.

As can be seen, the driving current Ioled (i.e., the driving signal) is related to only the data voltage Vdata, and is not related to the threshold voltage Vth of the third transistor T3, thereby eliminating influence of the threshold voltage shift of the driving transistor.

The data line terminal Data may be connected to the data line 11, the gate line terminal Gate may be connected to the gate line 12, a control electrode line terminal EM may be connected to the control electrode line 13, the first reset terminal Reset may be connected to the first reset line, the reset second terminal Reset' may be connected to the second reset line, and other terminals may be connected to corresponding signal sources, so as to provide corresponding voltages to the terminals.

Since a signal provided to the gate line terminal Gate is the same as that provided to the second reset terminal Reset' but differs by one period from that provided to the first reset terminal Reset', all of the gate line 12, the first reset line, and the second reset line, or a part of each of the gate line 12, the first reset line, and the second reset line, may be combined to be connected to a corresponding line. That is, the first reset terminal Reset may be connected to the gate line 12 in a previous row, and the second reset terminal Reset' may be connected to the gate line 12 in the current row.

In some embodiments, the driving signal (i.e., the driving current holed) from the above driving circuit 3 is generated by a second electrode of the third transistor T3 and output by the sixth transistor T6, and a second electrode of the sixth transistor T6 (i.e., the second node N2) is regarded as an output terminal 39 outputting the driving signal, so that the second node N2 should be connected to a corresponding light emitting device 2 (e.g., connected to a first electrode 21 (i.e., an anode) of an organic light emitting diode OLED). The connection between the second node N2 and the corresponding light emitting device 2 may be a direct connection (for the first local driving circuit 32, the second local driving circuit 33, etc.), or may be an indirect connection (for the peripheral driving circuit 31) through the connection line 6.

The specific circuit structure and driving timing of the above driving circuit 3 are not limited to the above examples, and other driving circuits 3 in the related art may be adopted, which is not described in detail herein.

The position (i.e., the output terminal 39) of the driving circuit 3 outputting the driving signal are different according to the specific circuit structure of the driving circuit 3, which is not described in detail herein.

Figure 6:
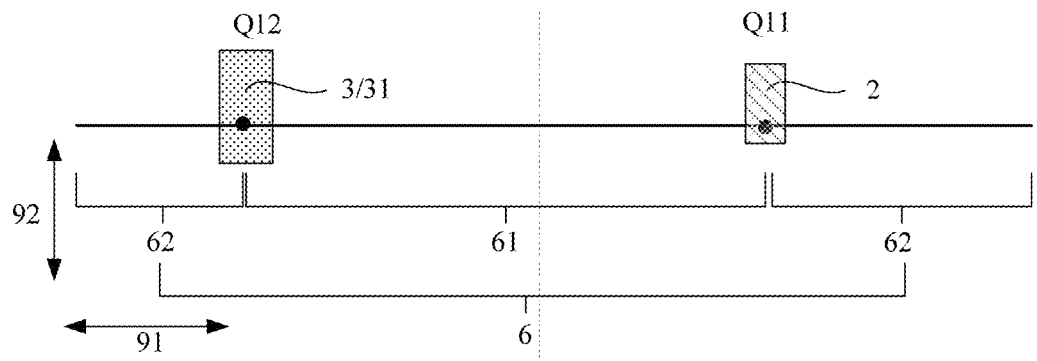
FIG. 6 is a schematic diagram illustrating a structure of a connection line in a display substrate according to an embodiment of the present disclosure.

Referring to FIG. 6, in the embodiments of the present disclosure, in addition to the connection portion 61 directly between (i.e., directly connected to) the light emitting device 2 and the corresponding driving circuit 3, the connection line 6 further includes an extension portion 62 "extending beyond" the connection portion 61.

That is, referring to FIG. 6, FIG. 7, FIG. 8, FIG. 9 and FIG. 11, although the distribution of connection portions 61 directly connecting the light emitting devices 2 to the driving circuits 3 is not uniform in the setup region Q1 due to the difference in the positions of the light emitting devices 2 and the driving circuits 3, the connection lines 6, each of which as a whole consists of the extension portion 62 and the connection portion 61, may be uniformly distributed in the setup region Q1 by extension portions 62.

Thus, in the embodiments of the present disclosure, the influence of the connection lines 6 at the positions in the setup region Q1 is substantially uniform. For example, a substantially same number of connection lines 6 overlap with the driving circuit 3 at the position in the transition region Q12 (e.g., overlap with the first node N1), so that the coupling effect of the connection lines 6 on each of the driving circuits 3 is also substantially the same, the display effect (e.g., brightness) of corresponding light emitting devices 2 (i.e., the light emitting devices 2 in the setup region Q1) is substantially uniform, and no brightness region or dark region occurs, thereby improving the display quality.

In some embodiments, each of the connection lines 6 is made of a transparent conductive material.

In order to avoid that the optical properties of the connection lines 6 influence the display and the image acquisition, the connection lines 6 may be made of a transparent conductive material.

For example, each of the connection lines 6 may be made of an indium tin oxide (ITO) material.

In some embodiments, the light emitting device 2 is an organic light emitting diode OLED.

As an implementation of the embodiments of the present disclosure, the light emitting device 2 may be an organic light emitting diode OLED, and accordingly, the connection line 6 may be connected to the first electrode 21 (e.g., an anode) of the organic light emitting diode OLED to provide the driving signal (e.g., the driving current) thereto.

It is also possible if other specific forms of light emitting devices 2 are adopted, and the connection lines 6 may be connected to the light emitting devices 2 at different positions in a case where the forms of the light emitting devices 2 are different.

In some embodiments, the display substrate further includes a display region Q2 adjacent to the setup region Q1.

The display region Q2 is provided with light emitting devices 2. Driving circuits 3 corresponding to the light emitting devices 2 in the display region Q2 are second local driving circuits 33 in the display region Q2.

The distribution density of the light emitting devices 2 in the setup region Q1 is smaller than the distribution density of the light emitting devices 2 in the display region Q2.

Figure 11:
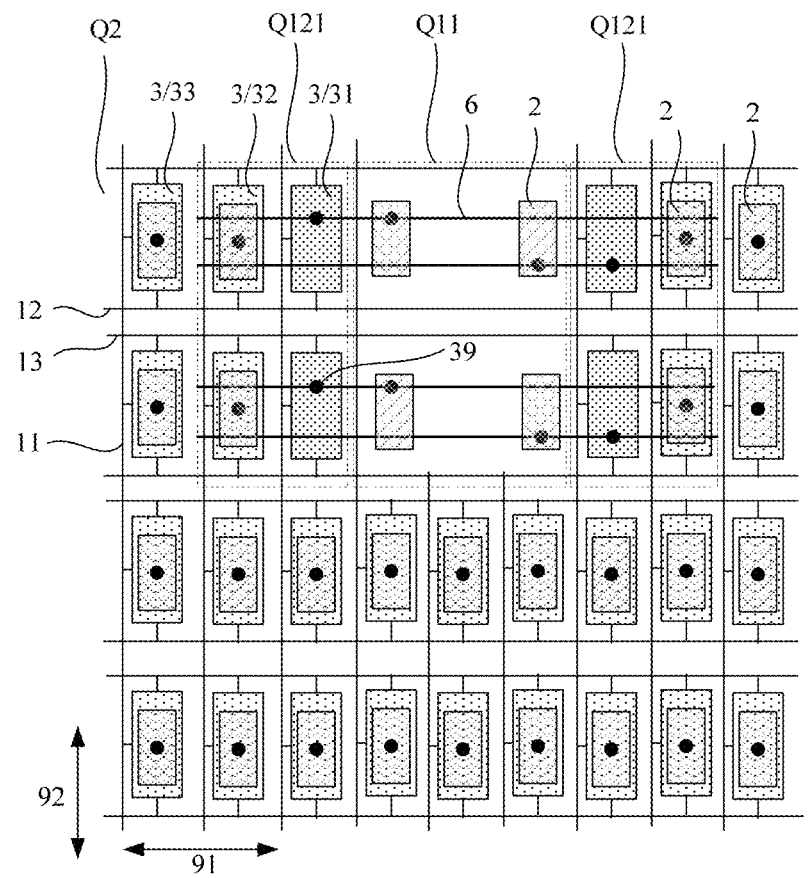
FIG. 11 is a schematic diagram illustrating a layout of connection lines in a partial region of a display substrate according to an embodiment of the present disclosure.

Referring to FIG. 5 and FIG. 11, most of the region of the display substrate may be the display region Q2 (i.e., a "normal display region") independent of the image acquisition unit. The display region Q2 is also provided with the light emitting devices 2, and the driving circuits 3 (referred to as "second local driving circuits 33") corresponding to the light emitting devices 2 may be directly provided in the display region Q2 (e.g., directly adjacent to the corresponding light emitting devices 2).

Referring to FIG. 11, since the display region Q2 is provided with neither the image acquisition unit nor the "additional" peripheral driving circuits 31, the distribution density of the light emitting devices 2 therein (i.e., the number of light emitting devices 2 per unit area) may be higher than the distribution density of the light emitting devices 2 in the setup region Q1. That is, the setup region Q1 (i.e., the region L) is of a lower "resolution (PPI)" compared to the display region Q2.

In some embodiments, the distribution density of the light emitting devices 2 in the acquisition region Q11 is the same as the distribution density of the light emitting devices 2 in the transition region Q12.

Referring to FIG. 7, FIG. 8, FIG. 9 and FIG. 11, in order to achieve more uniform display at different positions of the setup region Q1, the distribution density of the light emitting devices 2 may be the same at different positions (in the transition region Q12 and the acquisition region Q11) of the setup region Q1. That is, the "resolution (PPI)" at the positions of the setup region Q1 (i.e., the region L) may be the same.

In some embodiments, the transition region Q12 includes at least one sub-transition region Q121 outside and at least one side of the acquisition region Q11 in a first direction 91; and the connection line 6 which is connected to the peripheral driving circuit 31 in any one of the at least one sub-transition region Q121, extends into the acquisition region Q11 at least from a position in the sub-transition region Q121 which is farthest from the acquisition region Q11.

Referring to FIG. 5, the transition region Q12 may include a region (i.e., a sub-transition region Q121) outside the acquisition region Q11 in the first direction 91 (i.e., a left-right direction in FIG. 5).

To achieve the connection, the connection line 6 corresponding to the peripheral driving circuit 31 in each of sub-transition regions Q121 may extend in the first direction 91 into the acquisition region Q at least from the corresponding peripheral driving circuit 31.

In the embodiments of the present disclosure, referring to FIG. 7, FIG. 8, FIG. 9 and FIG. 11, no matter where the peripheral driving circuit 31 is located in the sub-transition region Q121 in the first direction 91, its corresponding connection line 6 extends from the position in the sub-transition region Q121 which is farthest from the acquisition region Q11, that is, each of all the connection lines 6 at least has the "extending portion 62" "extending in an opposite direction which is a direction from "its (the each of all the connection lines 6) corresponding peripheral driving circuit 31 to the position in the sub-transition region Q121, and the position in the sub-transition region Q121 is farthest from the acquisition region Q11.

Thus, referring to FIG. 7, FIG. 8, FIG. 9 and FIG. 11, all of the connection lines 6 are distributed throughout the sub-transition region Q121 in the first direction 91, so that although the peripheral driving circuits 31 are distributed at different positions in the sub-transition regions Q121, it does not cause non-uniform distribution of the connection lines 6 in the sub-transition regions Q121, and thus the distribution of the connection lines 6 in the setup region Q1 are more uniform.

In some embodiments, the transition region Q12 includes two sub-transition regions Q121 respectively outside and on two sides of the acquisition region Q11 in the first direction 91.

Figure 9:
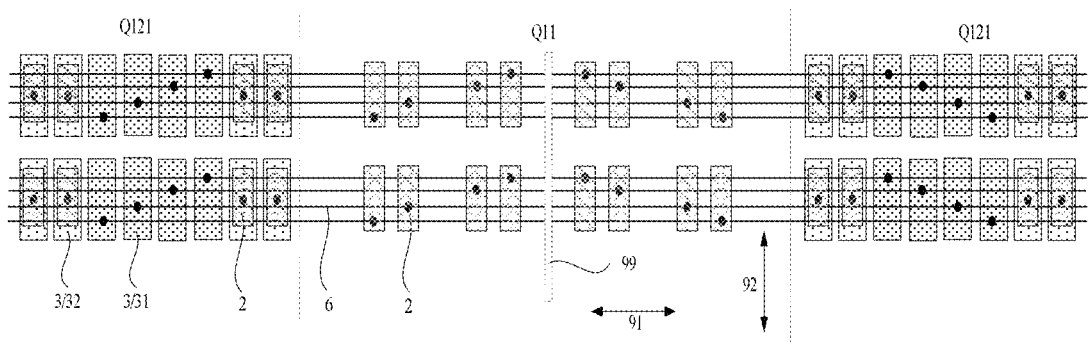
FIG. 9 is a schematic diagram illustrating a layout of connection lines in a partial region of a display substrate according to an embodiment of the present disclosure.

Referring to FIG. 5 and FIG. 9, as an implementation of the embodiments of the present disclosure, one sub-transition region Q121 may be provided on each of the two sides of the acquisition region Q11 in the first direction 91 (i.e., the left-right direction in FIG. 5).

In some embodiments, the peripheral driving circuits 31 corresponding to the light emitting devices 2 on any one side of a middle demarcation line position 99 in the acquisition region Q11 and in the first direction 91 are located in the sub-transition region Q121, which is outside the acquisition region Q11 and is on the same side of acquisition region Q11 in the first direction 91 as the corresponding peripheral driving circuits 31. The middle demarcation line position 99 is a middle position of the acquisition region Q11 in the first direction 91.

The connection line 6 connected to the peripheral driving circuit 31 in any one of the sub-transition regions Q121 extends at least from the position in the sub-transition region Q121, which is farthest from the acquisition region Q11, to the middle demarcation line 99 of the acquisition region Q11.

Referring to FIG. 5 and FIG. 9, as an implementation of the embodiments of the present disclosure, in a case where the two sub-transition regions Q121 are respectively located on the two sides of the acquisition region Q11 in the first direction 91 (i.e., the left-right direction in FIG. 9), the two sub-transition regions Q121 may respectively be provided to correspond to a "half" number of the light emitting devices 2 in the acquisition region Q11.

That is, referring to FIG. 9, the peripheral driving circuits 31 corresponding to the light emitting devices 2 in the left half of the acquisition region Q11 (i.e., on a left side of the middle demarcation line position 99) are in the sub-transition region Q121 on a left side of the acquisition region Q11, and the peripheral driving circuits 31 corresponding to the light emitting devices 2 in the right half of the acquisition region Q11 (i.e., on a right side of the middle demarcation line position 99) are in the sub-transition region Q121 on a right side of the acquisition region Q11, so that the peripheral driving circuits 31 may be connected to the "nearby" light emitting devices 2 in the acquisition region Q11 or may be connected to "neighboring" light emitting devices 2 in the acquisition region Q11.

Further, referring to FIG. 9, in this case, the connection line 6 corresponding to the peripheral driving circuit 31 in each of the sub-transition regions Q121 may extend from the position in the sub-transition region Q121 which is farthest from the acquisition region Q11 to the middle of the acquisition region Q11 (i.e., the middle demarcation line position 99) in the first direction 91, that is, "two groups" of connection lines 6 are separated from each other in the middle of the acquisition region Q11. In this case, each of the connection lines 6 further includes the "extension 62" continuously extending from its (each of the connection lines 6) corresponding light emitting device 2 to the middle demarcation line position 99 of the acquisition region Q11.

In some embodiments, the acquisition region Q11 is of a rectangle, and the acquisition region Q11 of the rectangle has two sides parallel to the first direction 91.

Each of the sub-transition regions Q121 is of a rectangle, and the sub-transition region Q121 of the rectangle has two sides parallel to the first direction 91.

Referring to FIG. 5, as an implementation of the embodiments of the present disclosure, both the acquisition region Q11 and the sub-transition regions Q121 may be of a "rectangle". One side of the acquisition region Q11 of the rectangle may coincident with one side of the sub-transition regions Q121 of the rectangle, and two other sides of both the acquisition region Q11 of the rectangle and the sub-transition regions Q121 of the rectangle are parallel to the first direction 91.

In some embodiments, the connection lines 6 connected to the peripheral driving circuits 31 in any one of the sub-transition regions Q121 are parallel to the first direction 91.

Referring to FIG. 2, the connection line 6 in the related art is "bent", which apparently increases the non-uniform of distribution of the connection lines 6.

Therefore, referring to FIG. 7, FIG. 8, FIG. 9 and FIG. 11, as an implementation of the embodiments of the present disclosure, the connection line 6 may be a "straight line" parallel to the first direction 91 (i.e., the left-right direction in the drawings), so that the distribution of the connection lines 6 is more uniform.

In some embodiments, in a second direction 92 perpendicular to the first direction 91, the connection lines 6 are uniformly distributed in the setup region Q1.

Referring to FIG. 7, FIG. 8, FIG. 9 and FIG. 11, in a case where each of the connection lines 6 is a "straight line", the connection lines 6 may be uniformly distributed in the second direction 92 (e.g., an up-down direction in the drawings) perpendicular to the first direction 91, so that the distribution of the connection lines 6 is more uniform.

The above "uniform distribution" does not mean that the distance between any two adjacent connection lines 6 must be the same in the second direction 92, but means that the connection lines 6 are uniformly distributed "generally" in the second direction 92.

Figure 7:
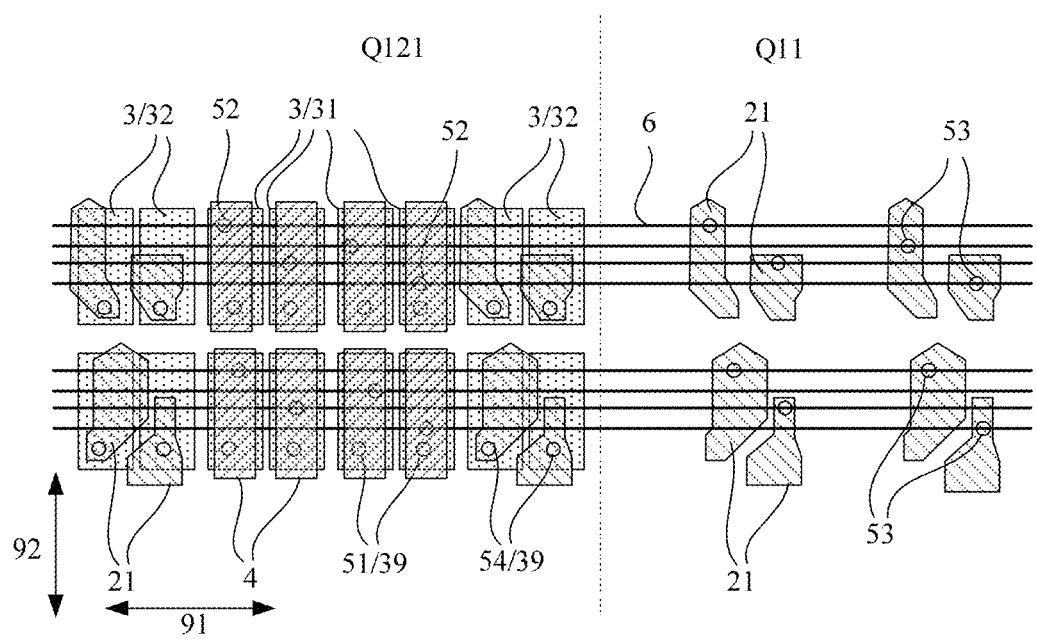
FIG. 7 is a schematic diagram illustrating a layout of connection lines in a partial region of a display substrate according to an embodiment of the present disclosure.
Figure 8:
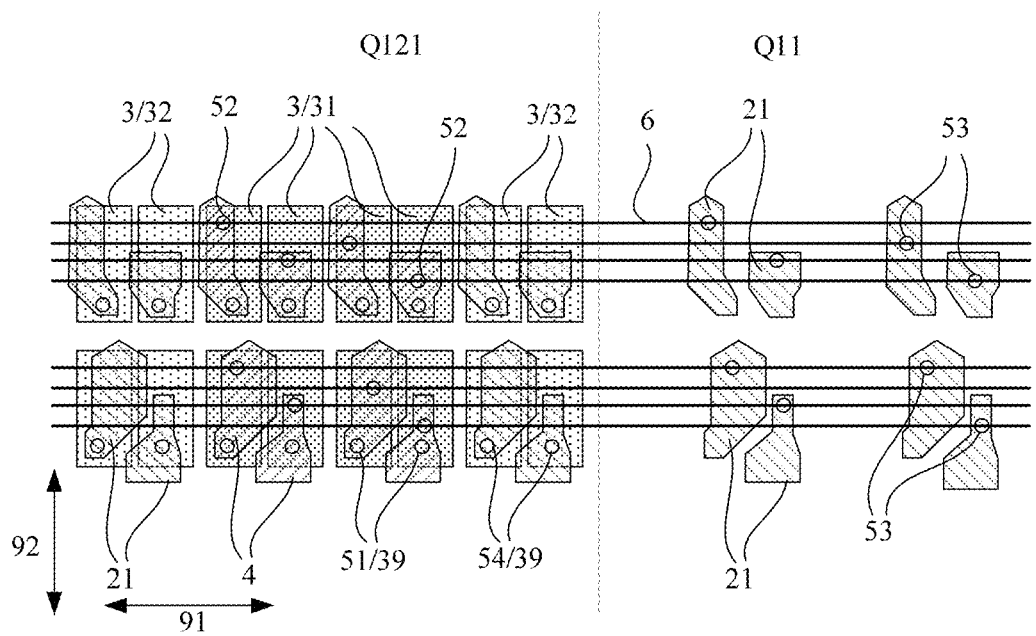
FIG. 8 is a schematic diagram illustrating a layout of connection lines in a partial region of another display substrate according to an embodiment of the present disclosure.

For example, referring to FIG. 7, FIG. 8 and FIG. 9, the connection lines 6 may be distributed only at the positions corresponding to each of "rows" of the light emitting devices 2 (i.e., the sub-pixels), for example, the number of the connection lines 6 corresponding to any row of the light emitting devices 2 may be the same, and the interval between the adjacent connection lines 6 may be the same, but there may be no connection line 6 between the light emitting devices 2 in different "rows".

In some embodiments, the driving circuit 3 includes an output terminal 39 configured to output the driving signal.

The driving circuits 3 in any one of the sub-transition regions Q121 are arranged in a plurality of rows parallel to the first direction 91. The output terminals 39 of a plurality of driving circuits 3 in a same row are arranged in a straight line parallel to the first direction 91.

A leading out structure 4 is provided corresponding to the peripheral driving circuit 31. At least one insulating layer is provided between the leading out structure 4 and the output terminal 39, and the leading out structure 4 is connected to the output terminal 39 of a corresponding peripheral driving circuit 31 through a first via hole 51. At least one insulating layer is provided between the connection line 6 and the output terminal 39. At least one insulating layer is provided between the connection line 6 and the leading out structure 4, and the connection line 6 is connected to a corresponding leading out structure 4 through a second via hole 52.

Any different second via holes 52 is located at different positions in the second direction 92 perpendicular to the first direction 91.

In order to achieve regulation and convenient manufacture of the structures in the setup region Q1, referring to FIG. 7 and FIG. 8, the plurality of driving circuits 3 in the sub-transition region Q121 may be arranged in an "array", that is, multiple driving circuits 3 are arranged in one row ("one row" in FIG. 7 and FIG. 8) in the first direction 91 (i.e., the left-right direction in FIG. 7, FIG. 8 and FIG. 9), so that the output terminals 39 of the driving circuits 3 in one row are also arranged in a straight line parallel to the first direction 91.

Thus, if the connection lines 6 corresponding to the multiple peripheral driving circuits 31 in one row extend in the first direction 91 directly via the output terminals 39, different connection lines 6 inevitably overlap with each other and are electrically connected to each other.

For this reason, referring to FIG. 7, FIG. 8, and FIG. 10, the output terminal 39 of each of the peripheral driving circuits 31 may be connected to the leading out structure 4 through the first via hole 51, so that first via holes 51 corresponding to the peripheral driving circuits 31 of a same row are located at a same position in the second direction 92 (a vertical direction in FIG. 7 and FIG. 8). However, the leading out structures 4 corresponding to different peripheral driving circuits 31 are connected to corresponding connection lines 6 through second via holes 52, and different second via holes 52 are located at different positions in the second direction 92. That is, the connection line 6 are "indirectly connected" to the output terminals 39 of the corresponding peripheral driving circuits 31 via the leading out structures 4 respectively, so that the connection lines 6 are actually connected to the leading out structures 4 at different positions in the second direction 92 respectively, i.e., the connection lines 6 are "electrically coupled" to the driving circuits 3 at different positions, although the output terminals 39 of the peripheral driving circuits 31 are arranged in a straight line parallel to the first direction 91.

Thereby, in a case where the connection lines 6 are "straight lines", different connection lines 6 are ensured to be located at different positions in the second direction 92, so that the uniform distribution of the connection lines 6 without overlapping with each other is achieved.

In FIG. 10, portions between blank portions in a lateral direction indicate a laminated relationship of the structures at a plurality of different positions, and do not indicate that the portions are necessarily in a cross section cut by a same plane.

FIG. 10 is only used to indicate the positions of the leading out structure 4, the connection line 6, and the like, and thus the partial structures thereof are not shown. Thus, FIG. 10 does not necessarily indicate actual structures at corresponding positions accurately.

In order to avoid unnecessary conduction, referring to FIG. 10, the output terminals 39, the leading out structures 4, and the connection lines 6 each are located in three different layers respectively, and the insulating layer is provided between any two of the three layers.

Referring to FIG. 7 and FIG. 8, since different connection lines 6 are located at different positions in the second direction 92, the connection positions of the connection lines 6 with corresponding light emitting devices 2 are also located at different positions in the second direction 92, that is, the different connection lines 6 are connected to the corresponding light emitting devices 2 at different positions in the second direction 92.

In order to simplify the structure, the structures of the peripheral driving circuit 31, the structures of the first local driving circuit 32, and the structures of the second local driving circuit 33 may be the same.

In some embodiments, the multiple driving circuits 3 in any one row include a plurality of first local driving circuits 32 and a plurality of peripheral driving circuits 31.

Multiple first local driving circuits 32 and multiple peripheral driving circuits 31 located in the same row are mixed in an arrangement in the first direction 91.

Referring to FIG. 7, FIG. 8, and FIG. 9, in order to achieve uniform distribution of the light emitting devices 2 in the sub-transition region Q121, in each row of the "array" of the driving circuits 3 in the sub-transition region Q121, the peripheral driving circuits 31 and the first local driving circuits 32 may be mixed in arrangement. The peripheral driving circuit 31 is connected to the leading out structures 4, and the leading out structures 4 is connected to the corresponding light emitting device 2 through the connection line 6, while the first local driving circuit 32 is connected directly to the light emitting device 2.

The above "mixed in arrangement" refers to that in a same row of the driving circuits 3, the first local driving circuits 32 and the peripheral driving circuits 31 are alternately present, rather than being respectively concentrated at different positions. However, the "mixed in arrangement" does not mean that the first local driving circuits 32 and the peripheral driving circuits 31 are necessarily present "one by one" in turn.

In some embodiments, a plurality of leading out structures 4 have a same shape.

As an implementation of the embodiments of the present disclosure, referring to FIG. 7, the plurality of leading out structures 4 corresponding to the plurality of peripheral driving circuits 31 may have a same shape (including pattern, direction in which the pattern extends, and size of the pattern), and the leading out structures 4 are more uniformly distributed, and the structures in the setup region Q1 are more uniformly distributed.

In some embodiments, the light emitting device 2 includes a first electrode 21.

The leading out structure 4 and the first electrode 21 are in a same layer.

The connection line 6 is connected to the first electrode 21 of the corresponding light emitting device 2 through a third via hole 53.

The output terminal 39 of the first local driving circuit 32 is connected to the first electrode 21 of the corresponding light emitting device 2 through a fourth via hole 54.

Referring to FIG. 7, FIG. 8 and FIG. 10, As an implementation of the embodiments of the present disclosure, the light emitting device 2 may include a first electrode 21, for example, the first electrode 21 may be an anode of an organic light emitting diode OLED, and the driving circuit 3 may be "electrically coupled" to the first electrode 21 to drive the light emitting device 2 to operate.

Thus, referring to FIG. 10, the leading out structure 4 may be provided in a same layer as the first electrode 21, so that both the leading out structure and the first electrode 21 may also be formed by a single patterning process, thereby simplifying the structure and the manufacturing process of the display substrate.

The connection line 6 may be connected to the first electrode 21 of the corresponding light emitting device 2 through the third via hole 53. That is, the leading out structure 4 is "bridged" to the first electrode 21 by the connection line 6.

The output terminal 39 of the first local driving circuit 32 (and the output terminal 39 of the second local driving circuit 33) may be directly connected to the first electrode 21 of the corresponding light emitting device 2 through the fourth via hole 54.

Since the leading out structure 4 and the first electrode 21 are in the same layer, the first via hole 51 (connecting the output terminal 39 to the leading out structure 4) and the fourth via hole 54 (connecting the output terminal 39 to the first electrode 21) are in the same insulation layer, while the second via hole 52 (connecting the leading out structure 4 to the connection line 6) and the third via hole 53 (connecting the first electrode 21 to the connection line 6) are also in the same insulation layer.

Since the leading out structure 4 and the first electrode 21 are in the same layer, an insulation layer is necessarily provided between the connection line 6 and the first electrode 21. Thus, in FIG. 7, FIG. 8, and FIG. 10, the connection line 6 may overlap with and be insulated from the first electrode 21.

In some embodiments, the shape of the leading out structure 4 corresponding to any one of the peripheral driving circuit 31 is the same as the shape of the first electrode 21 of the light emitting device 2 corresponding to the peripheral driving circuit 31.

Referring to FIG. 8, as an implementation of the embodiments of the present disclosure, in a case where the leading out structure 4 is in the same layer as the first electrode 21 of the light emitting device 2, in order to achieve more uniform of all the structures in the setup region Q1, the leading out structures 4 may has the same shape (including the pattern, direction in which the pattern is located, and size of the pattern) as the first electrode 21 of the corresponding light emitting device 2. That is, the first electrodes 21 and the leading out structure 4 of the same shape are in the layer in which the first electrode 21 are located, but the leading out structure 4 does not constitute the light emitting device 2.

The light emitting devices 2 may include light emitting devices of different colors, and the light emitting devices 2 of different colors may be the light emitting devices 2 directly emitting light of different colors; or all of the light emitting devices 2 may emit white light, and the white light is filtered by color filters (CFs) of different colors to be transferred to light of different colors.

As an implementation of the embodiments of the present disclosure, since the light emitting devices 2 of different colors have different luminous efficiencies and lifetimes, and human eyes have different sensitivity to light of different colors, referring to FIG. 8, the shapes (including areas) of the light emitting devices 2 of different colors may be different. That is, the shapes of the first electrodes 21 of the light emitting devices 2 of different colors may be different.

Therefore, the shape of the leading out structure 4 may be the same as the first electrode 21 of the corresponding (i.e. electrically coupled to) light emitting device 2, so that the distribution of the first electrodes 21 and the leading out structures 4 is generally the most uniform.

In some embodiments, a first planarization layer PLN1 is provided on a side of the output terminal 39 of the driving circuit 3 away from the base substrate 9.

The connection line 6 is on a side of the first planarization layer PLN1 away from the base substrate 9.

A second planarization layer PLN2 is provided on a side of the connection line 6 away from the base substrate 9.

The leading out structure 4 and the first electrode 21 are provided on a side of the second planarization layer PLN2 away from the base substrate 9.

The first via hole 51 and the fourth via hole 54 are located in the first planarization layer PLN1 and in the second planarization layer PLN2.

The second and third via holes 52 and 53 are located in the second planarization layer PLN2.

Referring to FIG. 10, as an implementation of the embodiments of the present disclosure, the first planarization layer PLN1 is provided on a side of the output terminal 39 of the driving circuit 3 away from the base substrate 9, and the connection line 6 is provided on the first planarization layer PLN1. The connection line 6 is further covered by the second planarization layer PLN2, and the light emitting device 2 is provided on the second planarization layer PLN2, for example, the first electrode 21 of the light emitting device 2 is in contact with the second planarization layer PLN2.

Thus, referring to FIG. 10, the above first and fourth via holes 51 and 54 extend through the first and second planarization layers PLN1 and PLN2, and the second and third via holes 52 and 53 are in the second planarization layer PLN2.

The driving circuit 3 and the light emitting device 2 may further include many other structures located in more other layers.

Referring to FIG. 10, exemplarily, in a direction gradually away from the base substrate 9, the display substrate may include the following structures in sequence.

(1) Semiconductor Layer (POLY Layer)

The semiconductor layer is made of a semiconductor material, such as a polysilicon material (poly-Si), and an active region of the transistor may be provided in the semiconductor layer.

The first and second electrodes of each of the transistors may also be provided in the semiconductor layer, as long as the semiconductor material at the positions where the first and second electrodes are located needs to be made conductive.

(2) Gate Insulation Layer GI

The gate insulation layer GI is made of an insulating material, such as silicon nitride, silicon oxide, silicon oxynitride, and the like.

(3) First Gate Layer (GATE1 Layer)

The first gate layer is made of a conductive material, such as a metal material.

The gate electrode of each of the transistors, the gate line terminals Gate, the gate line 12, the control terminal EM, the control electrode line 13, the first reset terminal Reset, the second reset terminal Reset', the first electrode of the storage capacitor Cst, and the like, may be provided in the first gate layer.

(4) First Interlayer Insulation Layer ILD1

The first interlayer insulation layer ILD1 is made of an insulating material, such as silicon nitride, silicon oxide, silicon oxynitride, and the like.

(5) Second Gate Layer (GATE2 Layer)

The second gate layer is made of a conductive material, such as a metal material.

The initialization terminal Vinit, the second electrode of the storage capacitor Cst, and the like, may be provided in the second gate layer.

(6) Second Interlayer Insulation Layer ILD 2

The second interlayer insulation layer ILD2 is made of an insulating material, such as silicon nitride, silicon oxide, silicon oxynitride, or the like.

(7) First Source and Drain Layer (SD1 Layer)

The first source and drain layer is made of a conductive material, such as a metal material.

The data lines terminal Data, the data line 11, the anode signal terminal VDD, and some of connection structures (e.g., the structures corresponding to the first node N1) between the electrodes may be located in the first source and drain layer.

The output terminal 39 of the driving circuit 3 (the structure connected to the second electrode of the third transistor T3) may also be located in the first source and drain layer.

(8) First Planarization Layer PLN1

The first planarization layer PLN1 is made of an organic insulating material and is used to eliminate a height difference due to underlying structure thereof, so that the connection line 6 may be provided on a substantially flat surface to avoid broken line or the like.

A portion of the first via hole 51 and a portion of the fourth via hole 54 are also provided in the first planarization layer PLN1.

(9) Connection Layer (ITO Layer)

The connection line 6 may be provided in the connection layer made of a conductive material, for example, a transparent conductive material, such as indium tin oxide (ITO).

(10) Second Planarization Layer PLN2

The second planarization layer PLN2 is made of an organic insulating material for eliminating a height difference due to underlying structures thereof, so that the leading out structure 4 and the first electrode 21 may be provided on a substantially flat surface.

The other portion of the first via hole 51 and the other portion of the fourth via hole 54 are also provided in the second planarization layer PLN2.

The second via hole 52 and the third via hole 53 are further provided in the second planarization layer PLN2.

(11) Anode Layer (Anode)

The anode layer is made of a conductive material, for example, a transparent conductive material, such as indium tin oxide (ITO).

The above leading out structure 4, and the first electrode 21 of the light emitting device 2 (e.g. an anode of an organic light emitting diode OLED), may be provided in the anode layer.

(12) Pixel Definition Layer (PDL)

The pixel defining layer may be made of an organic material for defining the range of the light emitting device 2.

(13) Light Emitting Layer

The light emitting layer may be made of an organic material, may at least include an organic light emitting layer (EML), and may further include other stacked auxiliary layers, such as an electron injection layer (EIL), an electron transport layer (ETL), a hole injection layer (HIL), a hole transport layer (HTL), and the like.

The light emitting layer may be of an entire layer structure, but the light emitting device 2 may be actually formed only at a position where the light emitting layer is in contact with the first electrode 21 (e.g., anode) through the pixel definition layer.

(14) Cathode Layer (Cathode)

The cathode layer may be made of a conductive material, for example, a metal conductive material, such as aluminum.

The second electrode of the light emitting device 2 (e.g. a cathode of an organic light emitting diode OLED) may be provided in the cathode layer. The cathode layer may be an entire layer structure, and the cathode signal terminal VSS of the driving circuit 3 is substantially located in the cathode layer.

(15) Encapsulation Layer

The encapsulation layer may be a stacked structure of organic layers and inorganic layers for encapsulating other structures therein.

Referring to FIG. 10, the leading out structure 4 is connected to the corresponding output terminal 39 through the first via hole 51 (in the first and second planarization layers PLN1 and PLN2) and is connected to the corresponding connection line 6 through the second via hole 52 (in the second planarization layer PLN2).

Referring to FIG. 10, the first electrode 21 is connected to the corresponding connection line 6 through the third via hole 53 (in the second planarization layer PLN2) and is connected to the corresponding output terminal 39 through the fourth via hole 54 (in the first and second planarization layers PLN1 and PLN2).

Of course, the specific arrangement relationship of the above layers is only exemplary, and the implementation of the embodiments of the present disclosure is not limited thereto. For example, the transistor may be of a bottom-type gate structure, i.e., the gate layer may be closer to the base substrate 9 than the semiconductor layer. For another example, the leading out structure 4 may be provided in other layers, or the connection line 6 may be provided in other layers, which will not be described in detail herein.

Figure 12:
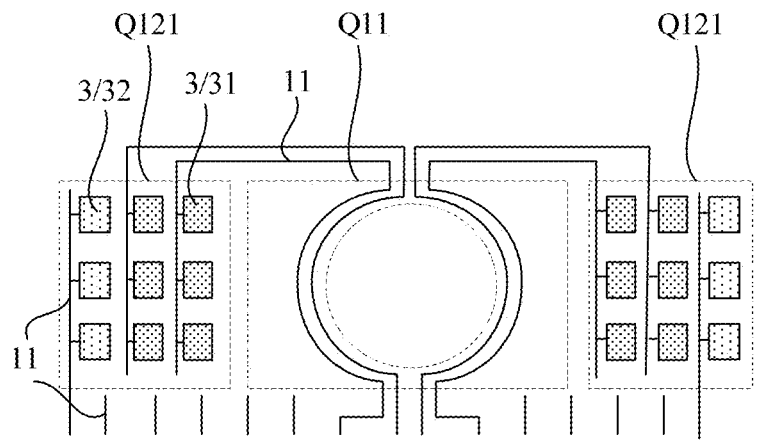
FIG. 12 is a schematic diagram illustrating a layout of data lines in a partial region of a display substrate according to an embodiment of the present disclosure.
Figure 13:
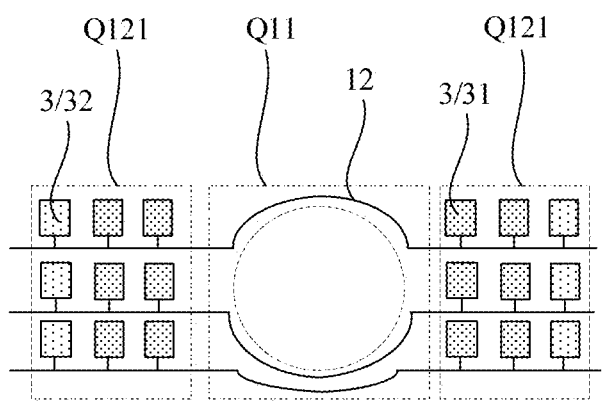
FIG. 13 is a schematic diagram illustrating a layout of gate lines in a partial region of a display substrate according to an embodiment of the present disclosure.
Figure 18:
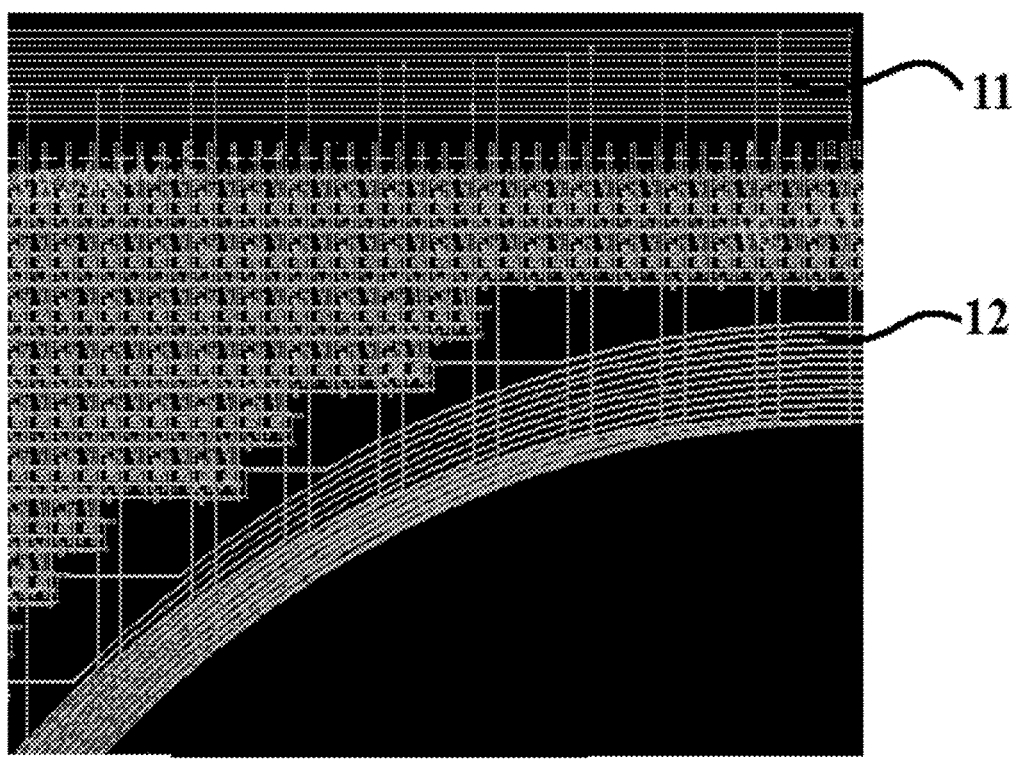
FIG. 18 is a schematic diagram illustrating a layout of data lines and gate lines in a partial region of a display substrate according to an embodiment of the present disclosure.

In the embodiments of the present disclosure, referring to FIG. 12, FIG. 13 and FIG. 18, the leads, such as the data line 11, the gate line 12, the control electrode line 13, and the like, are usually made of a metal material, so that they block light seriously, and thus the leads may "bypass" the region exactly corresponding to the image acquisition unit (a camera) so as to avoid affecting image acquisition.

Moreover, each of the leads is usually used to provide a voltage signal to the driving circuits 3 of one row or one column of sub-pixels (the light emitting devices 2). However, the peripheral driving circuits 31 corresponding to the light emitting devices 2 in the acquisition region Q11 are actually located in the transition region Q12, i.e., the peripheral driving circuits 31 and the driving circuits 3 corresponding to other light emitting devices 2 in the same row/column are not necessarily located in the same row/column, so that the leads corresponding to the peripheral driving circuits 31 also enter the transition region Q12 to provide voltage signals to the light emitting devices 2.

Exemplarily, referring to FIG. 12 and FIG. 13, in the acquisition region Q11, the region exactly corresponding to the image acquisition unit (a camera) may be a circular region (a region denoted in a circular dash in FIG. 12 and FIG. 13).

Exemplarily, referring to FIG. 5, the setup region Q1 may be located at the uppermost end of the display substrate, and an upper edge of the setup region Q1 is flush with an upper edge of the display region Q2.

Exemplarily, referring to FIG. 11, each of the gate lines 12 provides a voltage signal to the driving circuits 3 corresponding to the light emitting devices 2 in one row (the left-right direction in FIG. 11) (e.g., by being connected to the gate line terminals Gate of the driving circuits 3 respectively), each of the control lines 13 provides a voltage signal to the driving circuits 3 corresponding to the light emitting devices 2 in one row (e.g., be being connected to the control terminals EM of the driving circuits 3 respectively), and each of the data lines 11 provides a voltage signal to the driving circuits 3 corresponding to the light emitting devices 2 in one column (in an up-down direction in FIG. 11) (e.g., by being connected to the data line terminals Data of the driving circuits 3 respectively).

Thus, referring to FIG. 13 and FIG. 18, the gate line 12 corresponding to the setup region Q1 may "bypass" the circular region along the outside of the circular region.

Similarly, the control electrode line 13 corresponding to the setup section Q1 may "bypass" the circular region along the outside of the circular region.

Thus, referring to FIG. 12 and FIG. 18, the data line 11 corresponding to the setup region Q1 may be connected to a signal source (e.g., a pin of a driving chip) from below, extend into the acquisition region Q11 from below, then "bypass" the circular region along the outside of the circular region, then extend laterally from an upper of the setup region Q1, then extend downward into the sub-transition region Q121, and may be connected to the corresponding peripheral driver circuit 31 in the sub-transition region Q121.

Since the distribution density of the light emitting devices 2 (i.e., the sub-pixels) in the setup region Q1 is low, referring to FIG. 12, the number of columns of the light emitting devices 2 per unit area in the setup region Q1 may be smaller than that in the display region Q2, so that a part of the data lines 11 may be located only in the display region Q2 without entering the setup region Q1. The leads may not "bypass" the region that actually corresponds to the image acquisition unit (a camera).

The form of the display substrate of the embodiments of the present disclosure is not limited to the specific example described above.

For example, referring to FIG. 11, instead of terminating at the middle demarcation line position 99 in the acquisition region Q11, the connection lines 6 in the display substrate may be distributed throughout the entire setup region Q1 in the first direction 91, i.e., the connection line 6 extends between the boundaries, which are most away from each other, of the two sub-transition regions Q121.

For another example, referring to FIG. 11, instead of the connection lines 6 in the display substrate being connected to the output terminals 39 of the peripheral driving circuits 31 through the leading out structures 4 respectively, the output terminals 39 of the peripheral driving circuits 31 are directly located at different positions in the second direction 92, so that the connection lines 6 are directly connected to the corresponding output terminals 39 respectively.

For another example, referring to FIG. 11, the data line 11, the gate line 12, the control electrode line 13, and the like, in the display substrate may also "not bypass" a region in the acquisition region Q11 actually corresponding to the image acquisition unit (a camera), but directly pass across the acquisition region Q11.

For another example, referring to FIG. 11, the peripheral driving circuit 31 in the display substrate may be powered through the data line 11 corresponding to other "column" of the second local driving circuits 33, instead of being powered by "bypassing" the data line 11.

In a second aspect, the embodiments of the present disclosure provide a display panel. The display panel includes: any one of the above display substrates.

As an implementation of the embodiments of the present disclosure, a display panel having a display function may be formed by combining the above display substrate with other devices (e.g., a cell cover plate, a flexible printed board, a driving chip, a power supply module, and the like).

With the above display substrate, the display effect (such as brightness) of different positions of the setup region of the display panel is uniform.

In a third aspect, the embodiments of the present disclosure provide a display apparatus. The display apparatus includes: any one of the above display panels; and an image acquisition unit on a side of the display panel and at a position corresponding to the acquisition region of the display substrate.

As an implementation of the embodiment of the present disclosure, the above display panel may be combined with the image acquisition unit, so as to obtain a display apparatus having a display function and an image acquisition function.

Of course, the image acquisition unit is provided at a position corresponding to the setup region, more specifically at a position corresponding to the acquisition region, and more specifically at a region (e.g., a region denoted in a circular dash in FIGS. 12 and 13) actually corresponding to the image acquisition unit in the acquisition region.

If only one side of the display panel is regarded as a display side, the image acquisition unit should be on a side of the display panel away from the display side.

Due to the adoption of the above display substrate, the display effect (e.g., brightness) of different positions of the setup region of the display apparatus is uniform, and meanwhile, the display apparatus has a capability of acquiring images.

In some embodiments, the display apparatus is a full screen display apparatus.

As an implementation of the embodiment of the present disclosure, the display apparatus may be a full screen display apparatus in which all positions on the display side may be used for displaying. Since no non-display region for the image acquisition unit on the display side is specially provided when a display is performed on the display side, the embodiments of the present disclosure are more suitable for the full screen display apparatus.

In some embodiments, the display apparatus is an apparatus for display and acquiring images on the display side (i.e., a front camera is needed), such as a mobile phone, a tablet computer, a notebook computer, and the like.

The present disclosure has disclosed example embodiments; and although specific terms are employed, they are merely used and should be merely interpreted as having a general descriptive meaning only and not for the purpose of limitation. In some embodiments, it is apparent to those skilled in the art that, features, characteristics and/or elements described in connection with a particular embodiment may be used alone or in combination with features, characteristics and/or elements described in connection with other embodiments, unless otherwise defined. Therefore, those skilled in the art will understand that various changes in form and detail can be made without departing from the scope of the present disclosure set forth by the appended claims.

What is claimed is:

1. A display substrate, comprising a setup region having an acquisition region for an image acquisition unit arranged at a side of the display substrate away from a display side and a transition region adjacent to the acquisition region, wherein the display substrate comprises:
    a base substrate;
    a plurality of light emitting devices on the base substrate, wherein at least a part of the plurality of light emitting devices are provided at each of the acquisition region and the transition region; and
    a plurality of driving circuits on the base substrate, each of which comprises a driving transistor and is configured to provide a driving signal to a corresponding light emitting device; wherein
    driving circuits of the plurality of driving circuits corresponding to light emitting devices in the transition region are referred to as first local driving circuits which are located in the transition region;
    driving circuits of the plurality of driving circuits corresponding to light emitting devices in the acquisition region are referred to as peripheral driving circuits which are located in the transition region and are connected to the light emitting devices through connection lines, respectively; and
    at least a part of the connection lines each comprise: a connection portion between a corresponding light emitting device and a corresponding peripheral driving circuit, and an extension portion connected to the connection portion, and the connection lines are uniformly distributed in the setup region; and
    wherein the transition region comprises at least one sub-transition region outside the acquisition region on at least one side of the acquisition region in a first direction; and
    the connection line connected to the peripheral driving circuit in each of the at least one sub-transition region extends into the acquisition region at least from a position in the sub-transition region farthest from the acquisition region.

2. The display substrate of claim 1, wherein
the display substrate further comprises a display region adjacent to the setup region;
at least a part of the plurality of light emitting devices are provided in the display region; driving circuits corresponding to the light emitting devices in the display region are referred to as second local driving circuits which are located in the display region; and
a distribution density of the light emitting devices in the setup region is smaller than a distribution density of the light emitting devices in the display region.

3. The display substrate of claim 1, wherein
a distribution density of the light emitting devices in the acquisition region is identical to a distribution density of the light emitting devices in the transition region.

4. The display substrate of claim 1, wherein
each of the connection lines is made of a transparent conductive material.

5. The display substrate of claim 1, wherein
each of the plurality light emitting devices is an organic light emitting diode.

6. The display substrate of claim 1, wherein
the transition region comprises two sub-transition regions outside the acquisition region on two respective sides of the acquisition region in the first direction.

7. The display substrate of claim 6, wherein
the peripheral driving circuit corresponding to the light emitting device in the acquisition region on each side of a middle demarcation line position in the first direction is located in the sub-transition region which is on the same side of the acquisition region as the peripheral driving circuit in the first direction; and the middle demarcation line position is a position at a middle of the acquisition region in the first direction; and
the connection line connected to the peripheral driving circuit in each of the sub-transition regions extends at least from a position in the sub-transition region farthest from the acquisition region to the middle demarcation line position of the acquisition region.

8. The display substrate of claim 1, wherein
the acquisition region is of a rectangle, and two sides of the rectangle of the acquisition region are parallel to the first direction; and
each of the at least one sub-transition region is of a rectangle, and two sides of the rectangle of the sub-transition region are parallel to the first direction.

9. The display substrate of claim 8, wherein
the connection line connected to the peripheral driving circuit in each of the sub-transition regions is parallel to the first direction.

10. The display substrate of claim 9, wherein
in a second direction perpendicular to the first direction, the connection lines are uniformly distributed in the setup region.

11. The display substrate of claim 9, wherein
the driving circuits comprise output terminals configured to output the driving signals, respectively;

the driving circuits in each of the sub-transition regions are arranged in a plurality of rows parallel to the first direction; and the output terminals of the driving circuits in a same row are arranged in a straight line parallel to the first direction;

leading out structures are provided to correspond to the peripheral driving circuits, respectively; at least one insulating layer is provided between the leading out structures and the output terminals, and the leading out structure is connected to the output terminal of the peripheral driving circuit through a first via hole; at least one insulating layer is provided between the connection line and the output terminal; at least one insulating layer is provided between the connection line and the leading out structure; and the connection line is connected to the leading out structure through a second via hole; and every two different second via holes are located at different positions in the second direction perpendicular to the first direction.

12. The display substrate of claim 11, wherein the driving circuits in each row comprise multiple first local driving circuits and multiple peripheral driving circuits; and the multiple first local driving circuits and the multiple peripheral driving circuits in the same row are mixed to be arranged in the first direction.

13. The display substrate of claim 11, wherein
the leading out structures have a same shape.

14. The display substrate of claim 11, wherein
the light emitting device comprises a first electrode;
the leading out structure and the first electrode are in a same layer;
a corresponding connection line is connected to the first electrode of the light emitting device through a third through hole; and the output terminal of the first local driving circuit is connected to the first electrode of the light emitting device through a fourth via hole.

15. The display substrate of claim 14, wherein
a shape of the leading out structure corresponding to each of the peripheral driving circuits is the same as a shape of the first electrode of the light emitting device corresponding to the peripheral driving circuit.

16. The display substrate of claim 14, wherein
a first planarization layer is provided on a side of the output terminal of the driving circuit away from the base substrate;

the connection line is provided on a side of the first planarization layer away from the base substrate;

a second planarization layer is provided on a side of the connection line away from the base substrate;

the leading out structure and the first electrode are provided on a side of the second planarization layer away from the base substrate;

the first via hole and the fourth via hole are in the first planarization layer and in the second planarization layer; and the second via hole and the third via hole are in the second planarization layer.

17. A display panel, comprising:
the display substrate of claim 1.

18. A display apparatus, comprising:
the display panel of claim 17; and
the image acquisition unit on a side of the display panel and at a position corresponding to the acquisition region of the display substrate.

19. The display apparatus of claim 18, wherein
the display apparatus is a full screen display apparatus.

* * * * *